United States Patent [19]

Guddanti et al.

[11] Patent Number: 5,068,662
[45] Date of Patent: Nov. 26, 1991

[54] NEURAL NETWORK ANALOG-TO-DIGITAL CONVERTER

[75] Inventors: Suresh Guddanti; William P. Mounfield, Jr., both of Baton Rouge, La.

[73] Assignee: Board of Supervisors of Louisiana State University and Agricultural and Mechanical College, Baton Rouge, La.

[21] Appl. No.: 589,172

[22] Filed: Sep. 27, 1990

[51] Int. Cl.$^5$ .................... H03M 1/38; H03M 1/36
[52] U.S. Cl. ................................. 341/161; 341/159
[58] Field of Search ............. 341/161, 155, 159, 158; 364/807, 602; 307/201

[56] References Cited

U.S. PATENT DOCUMENTS

| | | | |
|---|---|---|---|
| 3,968,486 | 7/1976 | Gerdes | 341/161 |
| 4,660,166 | 4/1987 | Hopfield | 364/807 |
| 4,719,591 | 1/1988 | Hopfield et al. | 364/807 |
| 4,737,929 | 4/1988 | Denker | 364/807 |
| 4,926,180 | 5/1990 | Anastassiou | 341/159 |
| 4,965,579 | 10/1990 | Liu et al. | 341/159 |

OTHER PUBLICATIONS

"Computing with Neural Circuits: A Model," J. Hopfield and D. Tank, Science, Aug. 1986, vol. 233, pp. 625-632.
"Simple 'Neural' Optimization Networks: An A/D Converter, Signal Decision Circuit, and a Linear Programming Circuit," D. Tank and J. Hopfield, IEEE Transactions on Circuits and Systems, vol. CAS-33, No. 5, May 1986, pp. 533-541.
"An Investigation of Local Minima of Hopfield Network for Optimization Circuits," Lee and Sheu, IEEE International Conference on Neural Networks, pp. I-4-5-51 (Jul. 1988).

Primary Examiner—A. D. Pellinen
Assistant Examiner—Sharon D. Logan
Attorney, Agent, or Firm—John H. Runnels

[57] ABSTRACT

An asynchronous, rapid, neural network analog-to-digital converter. This converter requires only two different resistance values in R2R resistor ladders, and does not require both positive and negative biases. An average of n/2 steps is required for an n-bit conversion.

10 Claims, 1 Drawing Sheet

NEURAL NETWORK ANALOG-TO-DIGITAL CONVERTER

BACKGROUND OF THE INVENTION

This invention pertains to analog-to-digital converters, particularly as implemented in a neural network.

Analog-to-digital converters are used in a wide variety of applications. Existing analog-to-digital converters are primarily of four types (although this listing is not intended to be exclusive): counter, successive approximation, integrating, and flash. A counter is relatively slow, and can take up to $2^n$ steps for an n-bit conversion, with an average of $2^n-1$ steps. A successive approximation converter uses a single R2R resistor ladder, and takes n steps to make an n-bit conversion. An integrating converter, which measures the time elapsed until an increasing voltage ramp reaches the voltage of the input, is relatively accurate, but is expensive and is considerably slower than a successive approximation converter. A flash converter is quite fast, accomplishing a conversion in essentially one step, but is expensive and requires $2^n-1$ comparators in a single circuit for an n-bit conversion.

A neural network is a set of computational units whose interconnections are analogous to biological neurons. In general, any system whose interconnections resemble in some way those of biological neurons may be called a neural network. Each computational unit comprises a neuron, one or more inputs, and one or more outputs. An input for a neuron may be connected to the output of one or more other neurons. In some cases, a neuron may feedback on itself by connecting one of its inputs to one of its own outputs.

Classical neural networks are those which learn facts or patterns, and show associative recall of the stored patterns. J. Hopfield and D. Tank, "Computing with Neural Circuits: A Model," *Science*, Aug. 1986, Vol 233, pp 625-32, demonstrated the associative recall capability of such a neural network. Some neural network models have departed from the classical models, and have assumed a form more specific to the nature of the problem. For example, D. Tank and J. Hopfield, "Simple 'Neural' Optimization Networks: An A/D Converter, Signal Decision Circuit, and a Linear Programming Circuit," IEEE Transactions on Circuits and Systems, Vol CAS-33, No. 5, May 1986, pp 533-541, gave a model for a synchronous analog-to-digital converter circuit. The resistance values of the Tank and Hopfield converter are somewhat difficult to implement, and would become unwieldy for a large number of bits. The Hopfield circuit also requires both negative and positive biases, and requires a relatively large number of components. The circuit dynamics are based on analog dynamics.

Lee and Sheu, "An Investigation of Local Minima of Hopfield Network for Optimization Circuits," IEEE International Conference on Neural Networks, pp I-45 to 51 (July 1988) give a modification of the Tank and Hopfield circuit. This circuit is essentially similar to that of Tank and Hopfield, with the addition of some correction circuitry to overcome some of the problems encountered by the Tank and Hopfield circuit.

SUMMARY OF THE INVENTION

The neural network analog-to-digital converter of the present invention is an asynchronous, rapid, easy-to-implement converter using digital logic, and requiring only two different resistance values for the required resistors. This converter should be faster than analog-to-digital converters currently on the market, except for the flash converter, taking an average of n/2 steps to perform an n-bit conversion. The novel converter generally requires fewer circuit elements than does the flash converter, and thus should be less expensive in mass production, particularly for large numbers of bits per conversion. In particular, compared with $2^n-1$ comparators for the flash converter, the present converter requires only n comparators, which can result in a significant savings due to the expense of comparators of sufficient speed and accuracy.

The circuit comprises a set of n neurons, or logic elements, one neuron corresponding to each bit The conversion generally proceeds sequentially from the most significant bit to the least significant bit, although in many cases multiple steps in the conversion can proceed simultaneously, thereby reducing total conversion time to an average of n/2 steps.

An R2R resistor ladder is associated with each neuron, and generates an analog voltage which is the sum of (a) the analog voltage which would correspond to the associated bit if that bit had value 1, and (b) the analog voltages corresponding to all the more significant bits which have value 1, but not corresponding to those which have value 0. By comparing the voltage thus obtained to the analog input voltage, a decision is made as to whether he particular bit in question is 0 or 1.

The neural network configuration of his analog-to-digital converter is simpler to implement than are prior neural network analog-to-digital converters, having only two resistance values for the required resistors. It does not require both positive and negative biases. The prior neural network analog-to-digital converters require a greater number of different resistance values, and become unwieldy for large values of n, the number of bits in [he conversion. It is believed that the neural network analog-to-digital converter of the present invention has less difficulty with noise than do previous neural network analog-to-digital converters.

No clock is required to time individual bit conversions. The converter may be scaled to any number of bits, the limitations on such a scaling arising primarily from the precision or uniformity of the resistors, and from the accuracy or resolution of the comparators. This converter is well suited for implementation on a single LSI or VLSI circuit, with very short sample times—perhaps in the GHz range.

DETAILED DESCRIPTION OF THE INVENTION

Figure 1:
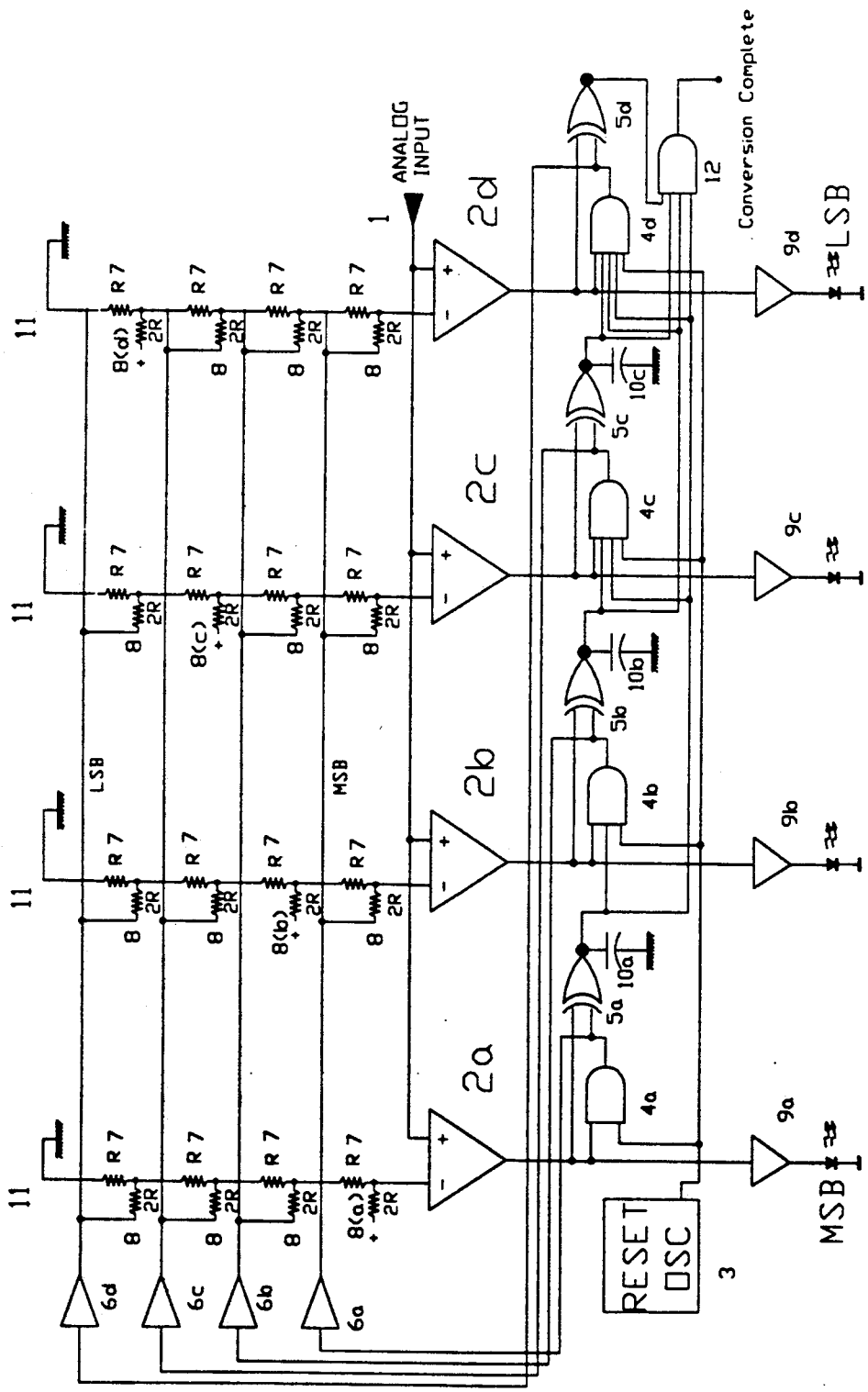
FIG. 1 illustrates an embodiment of the neural network analog-to-digital converter of this invention.

An embodiment of the present invention in illustrated in FIG. 1. This embodiment is a 4-bit analog-to-digital converter in which, for simplicity of the arithmetic, the analog input voltage may be taken to range between 0 and 16 volts. (In the breadboard embodiment of FIG. 1's circuit actually built and verified by the inventors, the voltage ranged between 0 and 12 volts. Scaling the range up to 16 volts makes no significance difference, but merely makes the numbers simpler for purposes of illustration.) The circuit comprises analog input 1, comparators 2(a) through 2(d), reset oscillator 3, AND gates 4(a) through 4(d), XNOR gates 5(a) through 5(d), buffers 6(a) through 6(d), resistors 7 each with resistance R, resistors 8 and 8(a) through 8(d) each with resistance 2R, buffers 9(a) through 9(d), capacitors 10(a) through 10(c), R2R ladders 11 comprised of resistors 7, 8 and 8(a) through 8(d), and AND gate 12.

An input voltage of 6.5 V will illustrate how the circuit operates. Analog input 1 received the 6.5 V input. For a reliable conversion, the input signal should be sampled [nd held constant until the converter indicates completion. This held analog input signal of 6.5 V was transmitted to the (+) leads of each of the comparators 2(a) through 2(d).

R2R ladders 11 of resistors 7 (R); 8, and 8(a) through 8(d) (2R) provided inputs to the (−) leads of comparators 2(a) through 2(d). Initially, as will be seen below, zero voltage was supplied to R2R ladders 11 from each of the buffers 6(a) through 6(d). Thus the only voltages initially supplied to R2R ladders 11 were the high voltages (16 volt) continually supplied to the 2R resistors 8(a) through 8(d).

R2R ladders 11 summed the voltages supplied by buffers 6(a) through 6(d), and 2R resistors 8(a) through 8(d) in the following manner: A high voltage from buffer 6(a) or resistor 8(a), corresponding to the most significant bit, contributed one-half the high voltage, or 8 volts in the present example, to the connected comparators. A high voltage from buffer 6(b) or resistor 8(b), corresponding to the second most significant bit, contributed one-fourth of the high voltage, or 4 volts in .he present example, to the connected comparators. Similarly, 2 volts corresponded to the third most significant bit, and 1 volt to the least significant bit. Thus at all times the (−) lead of comparator 2(a) received 8 volts plus the sum of any voltages corresponding to buffers 6(b), 6(c), and 6(d); that of comparator 2(b), 4 volts, plus the sum of any voltages corresponding to buffers 6(a), 6(c), and 6(d); that of comparator 2(c), 2 volts, plus the sum of any voltages corresponding to buffers 6(a), 6(b), and 6(d); and that of comparator 2(d), 1 volt, plus the sum of any voltages corresponding to buffers 6(a), 6(b), and 6(c).

Therefore the voltages initially seen by comparators 2(a), 2(b), 2(c), and 2(d) were 8, 4, 2, and 1 volt, respectively. When reset oscillator 3 transmitted a high signal, the corresponding leads to AND gates 4(a) through 4(d) went high. The output of comparator 2(a) went low because its (+) input, 6.5 V, was less than its (−) input, 8 V. This low output was transferred to three new inputs: to the input of buffer 9(a), which in turn signaled that 0 was the most significant bit; to the corresponding input to AND gate 4(a), whose output was therefore low; and to the corresponding input of XNOR gate 5(a). The low output of AND gate 4(a) was also input to buffer 6(a), which thus stayed low, and the voltages input to the (−) leads of comparators 2(b), 2(c), and 2(d) remained unchanged. XNOR gate 5(a) then had two low inputs, so its output was high.

Comparator 2(b) then had 6.5 V at its (+) lead, and 4 V at its (−) lead, so its output was high This high output was sent to three places: to buffer 9(b), which in turn signaled that 1 was the second most significant bit; to the corresponding input!of XNOR gate 5(b); and to the corresponding input of AND gate 4(b). The output of AND gate 4(b) was thus high, and buffer 6(b) went high and contributed 4 volts to the total inputs to the (−) leads of comparators 2(c) and 2(d). XNOR gate 5(b) then had two high inputs, so its output was high.

Comparator 2(c) then saw 6.5 V at its (+) lead, and 6 V at its (−) lead: 4 volts from buffer 6(b), and 2 volts from 2R resistor 8(c), so its output was high. Similarly to the events described for comparators 2(a) and 2(b), buffer 9(c) then indicated 1 for the third most significant bit, and buffer 6(c) went high.

Comparator 2(d) then saw 6.5 V at its (+) lead, and 7 V at its (−) lead: 4 volts from buffer 6(b), 2 volts from buffer 6(c), and 1 volt from 2R resistor 8(d), so its output was low. Similarly to the events described for comparators 2(a), 2(b), and 2(c), buffer 9(d) indicated 0 for the least significant bit, and the result of the conversion was 0110. An optional completion signal from AND gate 12 may then mark the end of the conversion.

For simplicity, the above discussion assumed that the conversion proceeded sequentially, bit-by-bit, from the most significant bit to the least significant bit. However, one advantage of the present invention is that in some cases more than one step in the conversion can occur simultaneously, reducing total conversion time.

The capacitors 10(a) through 10(c) were needed in the breadboard embodiment of the present invention built and tested by the inventors to slow the effective speed of the gates; otherwise, the gates acted more rapidly than the comparators, leading to erroneous results. If the delay time of the comparators were shorter than that for the gates, then the capacitors 10(a) through 10(c) could be eliminated from the circuit. The capacitors 10(a) through 10(c) delay propagation of the signal from the corresponding XNOR gates 5(a) through 5(c) to the input of the following AND gates 4(b) through 4(a) only when there is a change in the XNOR's output Otherwise, the capacitors do not affect the conversion or delay it.

One embodiment of a circuit according to the present invention is a circuit comprising:

(a) an analog input for receiving an analog input voltage;

(b) a plurality of n logic elements connected to said analog input, wherein n is an integer greater than 1, and wherein for each integer k greater than or equal to 1 and less than or equal to n, the kth logic element comprises:
  (i) a comparison voltage input for receiving a kth comparison voltage; and
  (ii) means for comparing whether the analog input voltage is greater than the kth comparison voltage; and
  (iii) if k is less than n, means responsive to said comparing means for the (k+1)st logic element, for inhibiting said kth logic element when the result of said comparing means for the (k+1)st logic element changes, until a selected time interval after the completion of said change; and (c) a plurality of n comparison voltage generators, one said comparison voltage generator connected to each of said comparing mans, wherein for each integer j greater than or equal to 1 and less than or equal to n, the jth comparison voltage generator comprises means for generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing means determined that} \\ & \text{the analog input voltage was greater than the } i\text{th} \\ & \text{comparison voltage;} \\ 0 & \text{if } i > j, \text{ and if the } i\text{th comparing means} \\ & \text{determined that the analog input voltage was} \\ & \text{less than the } i\text{th comparison voltage.} \end{cases}$$

Another embodiment of a circuit according to the present invention is a circuit comprising:

(a) an analog input for receiving an analog input voltage;

(b) a plurality of n logic elements connected to said analog input, wherein n is an integer greater than 1, and wherein for each integer k greater than or equal to 1 and less than or equal to n, the kth logic element comprises:

(i) a comparison voltage input for receiving a kth comparison voltage; and (ii) means for comparing whether the analog input voltage is greater than the kth comparison voltage; and (c) a plurality of n comparison voltage generators, one said comparison voltage generator connected to each of said comparing means, wherein for each integer j greater than or equal to 1 and less than or equal to n, the jth comparison voltage generator comprises means for generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing means determined that} \\ & \text{the analog input voltage was greater than the } i\text{th} \\ & \text{comparison voltage;} \\ 0 & \text{if } i > j, \text{ and if the } i\text{th comparing means} \\ & \text{determined that the analog input voltage was} \\ & \text{less than the } i\text{th comparison voltage.} \end{cases}$$

and wherein at least one of said comparison voltage generators comprises an R2R resistor ladder.

A voltage is "substantially proportional" to a particular number if the voltage is equal to the product of that number multiplied by a constant; or if the voltage differs from that product by an amount sufficiently small that the output of the voltage comparison is the same as it would be if the voltage exactly equaled that product; or if the difference between the voltage and that product is less than a certain tolerance which is considered acceptable in a particular environment in which the analog-to-digital converter is used.

The distribution of conversion times has been observed to be a binomial distribution with means n/2. Note that this is the distribution of conversion times over all possible input voltages; of course, the number of steps required for the conversion of a particular input voltage is not random, but deterministic.

This neural network analog to digital converter is well-suited for implementation on an LSI or VLSI chip.

Inspection reveals that almost half of the resistors in R2R ladders 11 are redundant, in the sense that the result of the conversion does not depend on voltages supplied to those resistors by buffers 6(a) through 6(d). In particular in FIG. 1, it will be seen that all resistors in each R2R ladder "further" from the corresponding comparator 2(a) through 2(c) than the associated 2R resistor 8(a), 8(b), or 8(c) are "redundant" in this sense. Thus the "redundant" resistors in each R2R ladder 11 (except in the R2R ladder corresponding to the least significant bit) could optionally all be replaced with a single equivalent resistance. This replacement would simplify the circuit, in the sense that he circuit would then have fewer elements, but would complicate it in the sense that a greater number of different resistance values would then be required.

An "AND" gate is a circuit element comprising an output and one or more inputs, where the output is "true" if and only if all the inputs are "true," and where the output is false otherwise. An "XNOR" gate for present purposes is defined to be a circuit element comprising an output and one or more inputs, where the output is true if and only if all inputs are identical, and is otherwise false. A comparator is a circuit element comprising first and second analog inputs, and a digital output, where the output is true if the voltage at the first analog input is greater than the voltage at the second analog input, and where the output is false if the voltage at the first analog input is less than the voltage at the second analog input.

Techniques known in the art for speeding up traditional A/D converters could also be applied to the present invention—for example, pipelining, sectioning, etc.

It is intended that this invention be construed to include any equivalents to the descriptions contained in the specification and claims, such as would result from a transformation of logic elements by DeMorgan's Theorem or as would result from substituting equivalent circuit elements.

It is intended that the apparatus claims be interpreted to read only on physical apparatus and not to read on any purely abstract mathematical formula or algorithm which is not embodied in some physical apparatus. It is intended that the process claims be interpreted to read only on processes implemented in physical apparatus, and not to read on any purely abstract mathematical formula or algorithm which is not embodied in some physical apparatus.

We claim:

1. A circuit comprising:

(a) an analog input for receiving an analog input voltage;

(b) a plurality of n logic elements connected to said analog input, wherein n is an integer greater than 1, and wherein for each integer k greater than or equal to 1 and less than or equal to n, the kth logic element comprises:

(i) a comparison voltage input for receiving a kth comparison voltage; and (ii) means for comparing whether the analog input voltage is greater than the kth comparison voltage; and (iii) if k is less than n, means responsive to said comparing means for the (k+1)st logic element, for inhibiting said kth logic element when the result of said comparing means for the (k+1)st logic element changes, until a selected time interval after the completion of said change; and (c) a plurality of n comparison voltage generators, one said comparison voltage generator connected to each of said comparing means, wherein for each integer j greater than or equal to 1 and less than or equal to n, the jth comparison voltage generator comprises means for generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing means determined that} \\ & \text{the analog input voltage was greater than the } i\text{th} \\ & \text{comparison voltage}; \\ 0 & \text{if } i > j, \text{ and if the } i\text{th comparing means} \\ & \text{determined that the analog input voltage was} \\ & \text{less than the } i\text{th comparison voltage.} \end{cases}$$

2. A circuit as recited in claim 1, wherein at least one of said logic elements additionally comprises means for outputting the result of said comparing means, and wherein said circuit additionally comprises means for indicating the completion of all of said comparing means.

3. A circuit as recited in claim 1, wherein at least one of said comparison voltage generators comprises an R2R resistor ladder.

4. A process for converting an analog input voltage into an n bit binary number, comprising:
   (a) receiving an analog input voltage;
   (b) for each integer k greater than or equal to 1 and less than or equal to n, wherein n is an integer greater than 1, comparing said analog input voltage to a kth comparison voltage;
   (c) for each integer j greater than or equal to 1 and less than or equal to n, generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing determined that} \\ & \text{the analog input voltage was greater than the } i\text{th} \\ & \text{comparison voltage}; \\ 0 & \text{if } i > j, \text{ and if the } i\text{th comparing determined} \\ & \text{that the analog input voltage was less than} \\ & \text{the } i\text{th comparison voltage; and} \end{cases}$$

(d) for each integer k greater than or equal to 1 and less than n, inhibiting said comparing or inhibiting said generating, when the result of said comparing for the (k+1)st logic element changes, until a selected time interval after the completion of said change.

5. A process as recited in claim 4, additionally comprising the steps of outputting the result of said comparing steps, and of indicating the completion of all of said comparing steps.

6. A process as recited in claim 4, wherein at least one of said generating steps comprises the use of an R2R resistor ladder.

7. A circuit comprising:
   (a) an analog input for receiving an analog input voltage;
   (b) a plurality of n logic elements connected to said analog input, wherein n is an integer greater than 1, and wherein for each integer k greater than or equal to 1 and less than or equal to n, the kth logic element comprises:
      (i) a comparison voltage input for receiving a kth comparison voltage; and
      (ii) means for comparing whether the analog input voltage is greater than the kth comparison voltage; and
   (c) a plurality of n comparison voltage generators, one said comparison voltage generator connected to each of said comparing means, wherein for each integer j greater than or equal to 1 and less than or equal to n, the jth comparison voltage generator comprises means for generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing means determined} \\ & \text{that the analog input voltage was greater than the } i\text{th} \\ & \text{comparison voltage}; \\ 0 & \text{if } i > j, \text{ and if the } i\text{th comparing means} \\ & \text{determined that the analog input voltage was} \\ & \text{less than the } i\text{th comparison voltage}; \end{cases}$$

and wherein at least one of said comparison voltage generators comprises an R2R resistor ladder.

8. A circuit as recited in claim 7, additionally comprising means for outputting the result of each of said comparing means, and means for indicating the completion of all of said comparing means.

9. A process for converting an analog input voltage into an n bit binary number, comprising:
   (a) receiving an analog input voltage;
   (b) for each integer k greater than or equal to 1 and less than or equal to n, wherein n is an integer greater than 1, comparing said analog input voltage to a kth comparison voltage;
   (c) for each integer j greater than or equal to 1 and less than or equal to n, generating the jth comparison voltage, wherein the jth comparison voltage is substantially proportional to $$\sum_{i=j}^{n} s_i 2^i,$$

wherein $$s_i = \begin{cases} 1 & \text{if } i = j; \\ 1 & \text{if } i > j, \text{ and if the } i\text{th comparing determined that the analog input voltage was greater than the } i\text{th comparison voltage;} \\ 0 & \text{if } i > j, \text{ and if the } i\text{th comparing determined that the analog input voltage was less than the } i\text{th comparison voltage;} \end{cases}$$

wherein at least one of said generating steps comprises the production of a comparison voltage with an R2R resistor ladder.

10. A process as recited in claim 9, additionally comprising the step of outputting the result of each of said comparing steps, and of indicating the completion of all of said comparing steps.

* * * * *

UNITED STATES PATENT AND TRADEMARK OFFICE
CERTIFICATE OF CORRECTION

PATENT NO. : 5,068,662

DATED : Nov. 26, 1991

INVENTOR(S) : Guddanti et al.

It is certified that error appears in the above—identified patent and that said Letters Patent is hereby corrected as shown below:

In the References Cited, under Other Publications, the page reference "I-4-5-51" for the Lee and Sheu reference should read -- I-45-51 --.
Column 2, line 15, "bit" should read -- bit. --.
Column 2, line 29, "he" should read -- the --.
Column 2, line 31 "his" should read -- this --.
Column 2, line 39, "[he" should read -- the --.
Column 3, line 11, "[nd" should read -- and --.
Column 3, line 62, "high" should read -- high. --.
Column 3, line 65, "input!of" should read -- input of --.
Column 4, line 35, "output" should read --output.--
Column 4, line 58, "mans," should read -- means, --.
Column 5, line 60, "means" should read -- mean --.
Column 6, line 4, "ladder" should read -- ladder 11 --.
Column 6, line 11, "he" should read -- the --.
Column 10 should be deleted in its entirety.

Signed and Sealed this

Sixteenth Day of March, 1993

Attest:

STEPHEN G. KUNIN

Attesting Officer

Acting Commissioner of Patents and Trademarks